United States Patent [19]

Chasse et al.

[11] Patent Number: 4,554,445
[45] Date of Patent: Nov. 19, 1985

[54] DIGITAL PULSE STRETCHER

[75] Inventors: Dennis W. Chasse, Nashua, N.H.;
Vincent M. Clark, Kingsboro, Mass.

[73] Assignee: Honeywell Information Systems Inc., Waltham, Mass.

[21] Appl. No.: 607,836

[22] Filed: May 7, 1984

[51] Int. Cl.$^4$ ............................................. G06K 7/10
[52] U.S. Cl. .................................................. 235/472
[58] Field of Search ........................................ 235/472

[56] References Cited

U.S. PATENT DOCUMENTS 3,761,685 9/1973 Alpert ................................ 235/472

Primary Examiner—Harold I. Pitts
Attorney, Agent, or Firm—Nicholas Prasinos

[57] ABSTRACT

An apparatus for varying the pulse width of a computer clock by adding a predetermined amount of time to the clock pulse width. A synchronous counter is combined with a latch into a circuit whereby a pulse input to the circuit resets both the latch and counter on the leading edge, and whereby the trailing edge of the input pulse releases the latch and counter allowing the counter to count clock pulses. On a predetermined pulse the counter's carry-output terminal clocks a logic high into the D latch terminal. Concurrently, an output from the latch is fed back to the counter's count-enable input to disable counting until a subsequent pulse resets the circuit. The net effect is to add a predetermined amount of time to the input pulse so that the extended pulse is available at the output of the latch.

17 Claims, 2 Drawing Figures

DIGITAL PULSE STRETCHER

RELATED APPLICATION

The following application is incorporated by reference to this application: entitled "Magnetic Stripe and Wand Reader Interface", inventor, Vincent Clark et al, Ser. No. 607,837, filed May 7, 1984.

BACKGROUND OF THE INVENTION

1. Field of the Invention

This invention relates generally to computer peripheral interfaces and more particularly to a logic circuit that adjusts the data clock output of a magnetic stripe reader to the receiver clock input of a programmable communications interface by adding a fixed unit of time to a digital pulse.

2. Description of the Prior Art

An ever-growing array of devices can be attached to a computer system for reading data into a computer. These can be devices by which data is entered by human operators, automatically from such storage devices of magnetic cards. With this type of a device, data stored in a magnetic card can be verified, and used as a form of employee identification. Typically a magnetic card is placed into an appropriate slot and pushed past a reading device which senses and reads the data encoded in the card. Another device for reading data into a computer is a hand-held magnetic wand. With this type of device, the data is encoded on a magnetic stripe deposited on a variety of mediums, such as a paper data card used for inventory in a factory. In order to read this magnetically-coded data, a wand-type reader is swept across the magnetic stripe, and data is transmitted from the wand mechanism to a computer or a communications line. Because each of these devices requires that some sort of data-bearing media be swept across the code-sensing device, this action has a tendency to produce shorter data pulses as the relative velocity increases. However, in order to interface the data clock output of a magnetic swipe reader or wand reader to the receiver clock input of a programmable communications interface for transmission to the computer, and not violate its timing specifications, it is necessary to provide a stable circuit that adds a fixed unit of time to a digital pulse.

In order to solve this problem, prior art methods utilized a combination of a monostable, multi-vibrator (one-shot), and a "D" type latch (flip-flop) along with interconnecting logic requiring resistor capacitor network for the one-shot. This type of solution had the disadvantage of having some time-out variations because of the effects of temperature, component tolerance and variations amongst one-shot parameters.

What is needed is a simple, low-cost and precise digital pulse stretcher which can interface with the data clock output of the magnetic swipe and wand-type readers to the receiver clock input of a programmable communications interface without violating its timing specification.

OBJECTS OF THE INVENTION

The primary object of the invention, therefore, is to provide an improved digital pulse stretcher.

Another object of the invention is to provide a digital pulse stretcher to interface the data clock output of magnetic or wand type readers to the receiver clock input of a programmable communications interface without violating its timing specifications.

Still another object of the invention is to provide an improved digital pulse stretcher which is stable under a variety of temperature conditions.

These and other objects of the invention will become apparent from the description of a preferred embodiment of the invention when read in conjunction with the drawings contained herewith.

SUMMARY OF THE INVENTION

The invention provides a combination of commercially available components, such as a 74LS161A synchronous counter, together with a 74LS74A D latch to provide a fixed amount of time added to the reader's clock pulse width. In operation, the pulse's input to the circuit of the invention resets both the latch and counter on its leading edge. The trailing edge of the input pulse releases the latch and counter allowing the counter to count one Megahertz system clock pulse. On the sixteenth pulse of the one Megahertz clock, the counter's carry output (terminal 101) via inverter 102's output, clocks a logic high into the D latch terminal. Concurrently, an output from the latch is fed back to the counter's count enable input to disable counting until a subsequent input pulse resets the circuit. The net effect is to add 15–16 microseconds to the input pulse so that the extended pulse is available at the output of the latch. This circuit has the advantage of not being sensitive to temperature variations and component tolerance variations and can be manufactured with minimum components.

BRIEF DESCRIPTION OF THE DRAWINGS

The novel features, which are characteristic of the invention, are set forth with particularity in the appended claims. The invention itself, however, both as to organization and operation, together with further objects and advantages thereof, may be understood by reference to the following description taken in conjunction with the drawings in which:

DESCRIPTION OF A PREFERRED EMBODIMENT OF THE INVENTION

Figure 1:
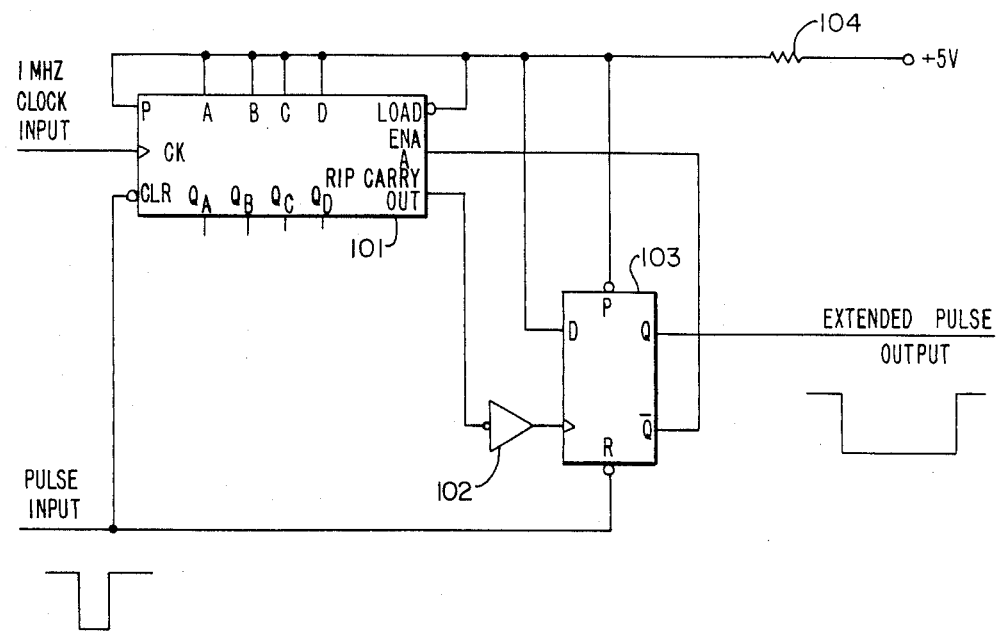
FIG. 1 is a logic block diagram of the invention.

Referring now to FIG. 1, there is shown a commercially available 74LS161A synchronous ripple counter 101, coupled to a commercially available 74LS74A D latch 103. The ripple carry output terminal of the counter 101 is coupled to the clock terminal of the latch 103 via an inverter 102. The clear terminal (CLR) of the counter 101 is coupled to the reset terminal R of latch 103. A +5V supply is coupled to the P, A, B, C, D, and load terminals of counter 101 through resistor 104. Additionally, the P terminal of latch 103 and the D terminal of latch 103 are also coupled to the +5V supply by a resistor 104. The count enable terminal (ENAT of counter 101) is coupled to the not Q terminal of latch 103. The Q terminal of latch 103 provides the extended pulse output.

In operation, a continuous stream of one Megahertz clocks are applied to the counter 101 at the clock terminal CK. As shown on FIG. 1, the pulse input is high; i.e., there is no pulse, and D latch may or may not be set. If D latch 101 is set all one Megahertz clock pulses inputted when the counter is in that state, will be counted. When the final state of the ripple counter 101 reaches a count of 15, the ripple carryout terminal of counter 101 goes high and is applied to the terminal of latch 103 via inverter 102. On the next clock pulse input, the counter rolls over to zero, and the ripple carryout terminal of counter 101 goes low and is applied to the clock terminal of latch 103 via inverter 102. At this point, the Q terminal of flip-flop 103 becomes high, (set) whereas the $\overline{Q}$ terminal becomes low. Since the $\overline{Q}$ terminal is coupled to the enable terminal of counter 101, this low signal from the $\overline{Q}$ terminal applied to the enable terminal of counter 101 will disable the counter. In this state, the circuit has been conditioned and is waiting for an input pulse from the reader (not shown). When the input pulse occurs, the leading edge of the pulse goes negative; i.e., goes to a logic zero (low). Since this low signal is applied to the reset terminal R of flip-flop 103, the latch (flip-flop) is reset, and the Q output terminal goes to a logic zero. The leading edge of the input pulse not only resets the flip-flop, but also holds the counter at count ZERO for the duration of the input pulse. On the trailing edge of the input pulse, the signal goes high and accordingly releases the clear terminal of the counter and the reset terminal of the flip-flop. The flip-flop remains in the state that it was, but the counter begins to count 1 Megahertz clocks. When the counter reaches the 15th count, the ripple carryout terminal of counter 101 goes high; on the 16th count it returns low. This signal is inverted in inverter 102, and its signal is applied to the clock terminal C of latch 103. The Q terminal of flip-flop 103 then goes high. Simultaneously, the $\overline{Q}$ terminal goes low and disables the counter 101 from continuing to count. The effect has been, therefore, to add 15 to 16 microseconds to the trailing edge of the pulse input. (The uncertainty is due to the asynchronous nature of the input pulse relative to the 1 Megahertz clocks.) Since the counter is responsive to microsecond clock counts which are precise and constant, the extended pulse output will not vary because of temperature or component variations.

Figure 2:
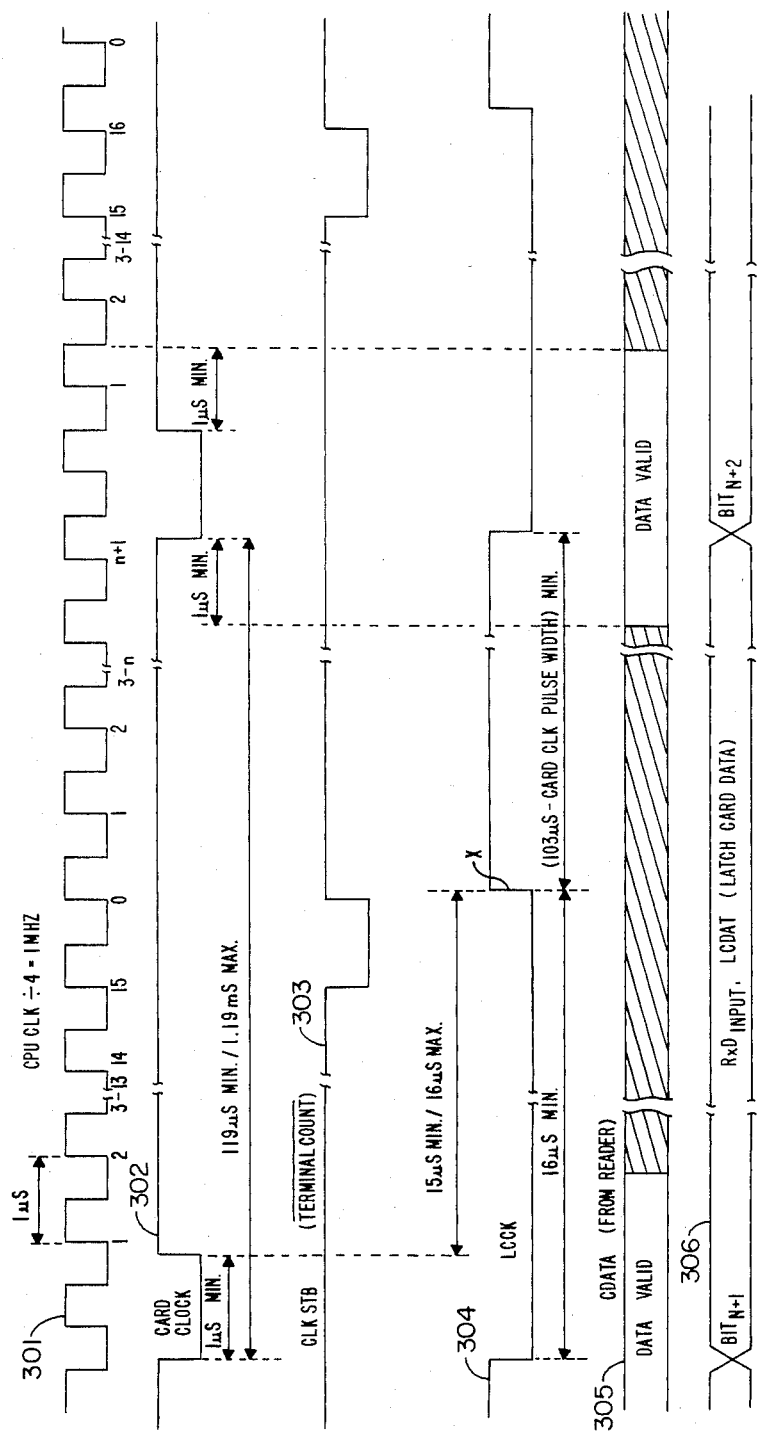
FIG. 2 is a timing diagram which illustrates the timing characteristics of the invention.

Referring now to FIG. 2, there is shown a pulse stream 201 which represents the 1 Megahertz clock inputs to the clock terminal of counter 101. Pulse 202 represents a pulse which is derived when a magnetic card bearing coded signals is swiped past a card reader, or a wand-type reader is passed over an encoded magnetic stripe. The pulse 202 is applied to the clear terminal CLR of counter 101 and to the reset terminal R of latch (flip-flop) 103. Pulse 203 is the inverted ripple carry output from the ripple carry output terminal of counter 101, which clocks the flip-flop and causes the Q terminal to go high and the $\overline{Q}$ to go low, thus disabling the counter.

Pulse 204 is the actual pulse output at the Q terminal of latch 103. Accordingly, upon the occurrence of a card clock 202 (i.e. pulse input) from a magnetic swipe or wand reader, the card clock signal 202 goes low. This immediately causes the Q output terminal of latch 103 to go low, shown on FIG. 2 as 202. When the card clock pulse 202 transitions high again, the output Q terminal of latch 103 remains low as described supra. Then the counter 101 counts 15 rising edges of clock 201. At the occurrence of the 15th rising edge, the ripple carry output, through inverter 102, is shown by diagram 203. It is seen that on the rising edge of the 15th one Megahertz cycle clock, the clock input to flip-flop 103 goes low. On the occurrence of the 16th clock of the count, the input to the clock of flip-flop 103 goes high, as shown on diagram 203, and thus the Q terminal of flip-flop 103 goes high and the $\overline{Q}$ terminal of flip-alop 103 goes low, disabling the counter and terminating the count. Thus, an input of one microsecond card clock 203 has been stretched to a 16–17 microsecond clock output of 204.

It will be apparent from the foregoing disclosure of the invention that numerous modifications, changes and equivalents will now occur to those skilled in the art, all of which fall within the true scope contemplated by the invention.

What is claimed is:

1. A digital pulse stretch circuit for adding a predetermined amount of time to the duration of the input pulse of a wand type or magnetic card reader, the input pulse having a rising edge and a trailing edge, said digital pulse stretcher comprising:
  (a) a system clock for generating clock pulses;
  (b) first means coupled to said wand type or magnetic card reader and to said system clock for counting the clock pulses applied to it and generating a first output signal after a predetermined number of counts;
  (c) second means coupled to said first means and to said wand type or magnetic card reader and responsive to the trailing edge of the input pulse to activate said second means, and further responsive to the first output signal to deactivate said second means, whereby the input pulse has been extended by the predetermined number of counts.

2. The circuit as recited in claim 1 wherein said first means is a commercially-available synchronous counter.

3. The circuit as recited in claim 2 wherein said second means is a commercially-available D latch.

4. The circuit as recited in claim 3 wherein said second means is activated by the trailing edge of the input pulse by resetting said second means and causing the output pulse to go low.

5. The circuit as recited in claim 4 wherein said second means is deactivated by the first output signal by causing the output pulse to go high.

6. An interface system for interfacing a bar code wand type reader or magnetic swipe reader supplying input pulse signals to a microprocessor via a bus system comprising:
  (a) first means for converting data in the form of data bits to data in the form of characters, each character comprising a predetermined plurality of data bits;
  (b) second means coupled to said first means for storing data in a valid state until said first means is ready to accept said valid data;
  (c) third means coupled to said second means for selecting input pulse signals either from said wand type reader or magnetic card reader for application to said first means;
  (d) fourth means coupled to said third means for eliminating noise from the signals derived from said wand type reader or magnetic card reader; and
  (e) pulse stretcher means coupled to said first, second and third means for adding a predetermined amount of time to the input pulse signals.

7. The interface system of claim 6 including fifth means coupled to said third means and responsive to said first means for providing select-signals to said third means from said first means for selecting the signals from either the want type reader or magnetic swipe reader.

8. The interface system of claim 6 wherein said first means also provides a unique start symbol for the predetermined plurality of data bits, whereby such start symbol frames the character.

9. The interface system as recited in claim 7 wherein said first means includes a plurality of storage means for storing the predetermined plurality of data bits (i.e. character).

10. The interface system as recited in claim 9 including sixth means coupled to said first means for selecting one of said plurality of storage means.

11. The interface system as recited in claim 10 wherein said first means includes write means for providing first control signals writing data into said microprocessor.

12. The interface system as recited in claim 11 wherein said first means includes read means for providing second control signals for reading data from said microprocessor.

13. The interface system as recited in claim 12 including address means coupled to said write and read means for addressing said write or read means.

14. An interface system for interfacing a wand type reader or magnetic card reader for reading input signals to a microprocessor comprising:
   (a) first means for converting data coded in bits to data coded in characters, each character comprising a predetermined number of bits;
   (b) second means coupled to said first means for storing bit coded data in a valid state;
   (c) clock means coupled to said first and second means for strobing the bit coded data from said second means to said first means;
   (d) third means coupled to said second means for selecting signals either from said wand type reader or magnetic card reader for application of said first means; and
   (e) pulse stretcher means coupled to said first, second and said clock means for stretching the input signals.

15. The interface system as recited in claim 14 wherein said wand type reader and magnetic type reader include indicator light and buzzer signals for indicating the state of data transmitted.

16. The interface system as recited in claim 15 including indicator-storage-signal means for storing indicator signals utilized to activate the light or buzzer signals on said wand type or magnetic readers.

17. A method of interfacing data readers capable of reading bar codes to a microprocessor wherein the data readers provide a serial data bit signal and a control bit for every data bit signal and wherein said microprocessor requires data in character format comprising a predetermined number of bits set off by a start symbol, said method comprising:
   (a) a plurality of serial bit streams, each bit in the stream comprising data;
   (b) providing a control signal for each data bit generated;
   (c) selecting one of said plurality of serial bit streams with the associated control signals;
   (d) determining when data in said selected bit streams and its attendant control signal is valid;
   (e) storing the valid data and its associated control bit;
   (f) assembling the valid data into groups of bits (characters);
   (g) providing such characters to said microprocessor; and,
   (h) stretching the duration of the serial data bit signal by a predetermined amount.

* * * * *